United States Patent [19]

Ehnholm

[11] Patent Number: 5,537,040
[45] Date of Patent: Jul. 16, 1996

[54] APPARATUS AND METHOD FOR MAGNETIC RESONANCE IMAGING USING PRE-POLARIZING FIELD

[75] Inventor: Gösta Ehnholm, Helsinki, Finland

[73] Assignee: Picker Nordstar, Inc., Finland

[21] Appl. No.: 362,735

[22] Filed: Dec. 22, 1994

Related U.S. Application Data

[63] Continuation of Ser. No. 86,788, Jul. 2, 1993, abandoned.

[30] Foreign Application Priority Data

Jul. 3, 1992 [FI] Finland ................................ 923080

[51] Int. Cl.⁶ .................................................. G01R 33/20
[52] U.S. Cl. .................................................. 324/319; 335/299
[58] Field of Search ........................................ 324/318, 322, 324/320, 319; 335/294, 301

[56] References Cited

U.S. PATENT DOCUMENTS

| | | | |
|---|---|---|---|
| 4,723,116 | 2/1988 | Muller et al. ......................... | 324/320 |
| 4,766,378 | 8/1988 | Danby et al. ......................... | 324/307 |
| 4,998,976 | 3/1991 | Rapoport ............................... | 324/318 |
| 5,063,934 | 11/1991 | Rapoport et al. ..................... | 324/321 |

FOREIGN PATENT DOCUMENTS 92018993  10/1992  WIPO ................................... 335/304

*Primary Examiner*—Sandra L. O'Shea
*Assistant Examiner*—Raymond Y. Mah
*Attorney, Agent, or Firm*—Andrus, Sceales, Starke & Sawall

[57] ABSTRACT

In an apparatus and method for magnetic resonance imaging, an imaging field ($B_p$) and a pre-polarization field ($B_p$) are generated by means of electromagnetic coils ALC in an air gap between pole pieces of a magnet core. The pole pieces are designed such that, as the current in the coils is increased, the field strength increases only in the central area between pole pieces up to the strength ($B_p$) of the pre-polarization field. This is due to the saturation of the edge zones of pole pieces that restricts the increase of field strength in the edge zones of the air gap.

14 Claims, 2 Drawing Sheets

APPARATUS AND METHOD FOR MAGNETIC RESONANCE IMAGING USING PRE-POLARIZING FIELD

The present application is a continuation application of U.S. patent application Ser. No. 08/086,788, filed Jul. 2, 1993, and now abandoned.

BACKGROUND OF THE INVENTION

The present invention relates to an apparatus and method for performing magnetic resonance imaging in a preferred fashion and effectively by using a pre-polarizing field.

The principles of magnetic resonance imaging, including the use of a pre-polarizing field, are disclosed in U.S. Pat. No. 4,906,931, naming Raimo Sepponen as inventor, as well as in the corresponding prior Finnish Patent application.

Magnetic resonance imaging is presently a generally applied diagnostic imaging method, which renders results that are superior over other modalities (X-ray, ultrasound). A drawback is the high price of the apparatus, typically 1–3.5 million U.S. dollars. Therefore, it is important to discover methods of bringing the price down. One way is to perform the imaging in lower fields as this is a way of lowering the price of the most expensive component of the apparatus, which is the magnet. However, this impairs the quality of images as the signal they originate from becomes more noisy. Namely, this image signal, which is developed by the resonance of protons in an imaging field $B_o$, is proportional to the magnetization of protons which in turn is proportional to the magnitude $B_o$ of that field. Thus, for example, if the field is halved, the obtained signal-to-noise ratio (s/n) will also be halved. This can be compensated for by prolonging the imaging time by a factor of four, but in practice this will lead to times that are too long for patients to be imaged.

Since a high quality image is generally considered very important, most of the commercially available equipment is provided with expensive magnets. The most common type is a superconductive magnet, which is capable of producing highest fields, 0.5–2 Teslas, but which are the most expensive to manufacture and operate. The second most common are permanent magnets having a typical field intensity or magnetic flux density of 0.2–0.3 Teslas.

The least popular is an electromagnet, due to the fact that the power and cooling required thereby will be inconvenient at high field intensities. Typically, the power rises up to tens of kilowatts for suitable fields.

The electromagnets can be provided with an air core, as in the figures of the Sepponen patent, or fitted with an iron core. In the latter, an air gap flux passing through the imaging zone is carried from one pole piece to the other by way of a closed, magnetic circuit formed in the iron. An advantage offered by the iron core magnet over one with an air core is a lower power demand, but the greater weight is a drawback. When the field is increased, the weight rapidly increases to tens of tons, since the circulating flux requires everywhere along its route a sufficiently large cross-surface area in order not to exceed the iron saturation flux density, about 1.6–1.8 Teslas.

The Sepponen patent describes a way of constructing an inexpensive and good imaging system by using a so-called pre-polarizing field. Thus, an image is developed in a per se known manner in a homogeneous and stable field $B_o$, which can be moderately low, for example $B_o$ equal 0.05–0.1 Teslas, whereby it can be produced inexpensively either by an electromagnet or permanent magnet. Prior to the actual imaging event, the field is momentarily increased to a higher value $B_p$ for magnetizing the protons of an object to be imaged. The magnetization occurs exponentially as a function of time, the typical time constants for this being in various human tissues on the order of 0.1–1 seconds, which is thus also a suitable duration for the polarization field. By virtue of pre-polarization, the proton magnetization increases by the factor of approximately $B_p/B_o$, whereby the s/n ratio is of the same order as in an apparatus which only employs a single field intensity, if such value is selected to be $B_p$.

The advantages of pre-polarization occurs in two ways: first of all, a high field is only kept on some of the time, which saves power. Secondly, the field $B_p$ need not be particularly homogeneous and this contributes to further saving. In case of air-core electromagnets, field $B_p$ can be created by means of an additional winding which, with the same power, produces more field than the magnet for the field $B_o$ as it can be smaller. This is described in the Sepponen patent.

SUMMARY OF THE INVENTION

The present novel invention relates to a technique of developing a pre-polarizing field in a particularly simple and inexpensive fashion. A magnet employed in the invention may be an iron-core equipped electromagnet.

BRIEF DESCRIPTION OF THE DRAWINGS

The operating principle and several practical embodiments of the invention are illustrated in the accompanying drawings, in which.

BRIEF DESCRIPTION OF THE PREFERRED EMBODIMENT

A magnetic field $B_o$ is developed across an object P to be imaged by means of iron pole pieces IPP equipped with aluminum strip or copper wire coils ALC. The apparatus also includes gradient coil systems GC with a power source system GPS connected thereto as well a radio-frequency coil systems RFC and a radio frequency transceiver RFX connected thereto. A power source MPS supplies a current required for producing a magnetic field by means of aluminum coils ALC. Both the gradient-coils power source system GPS and the radio frequency transceiver RFX are controlled by a central processor CPU, which is further controllable from a console C.

Figure 1:
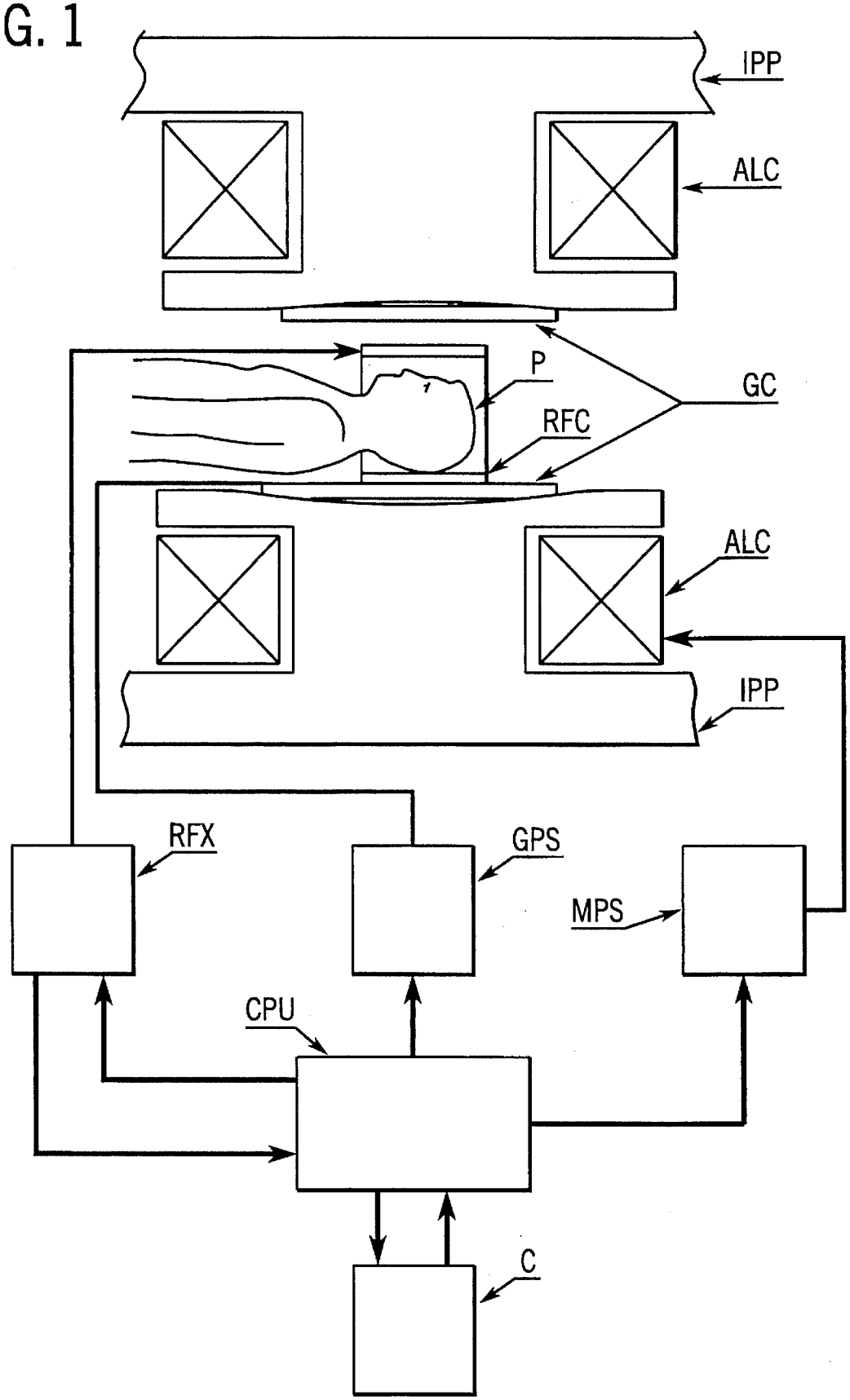
FIG. 1 shows magnetic-resonance imaging apparatus of the present invention.
Figure 2:
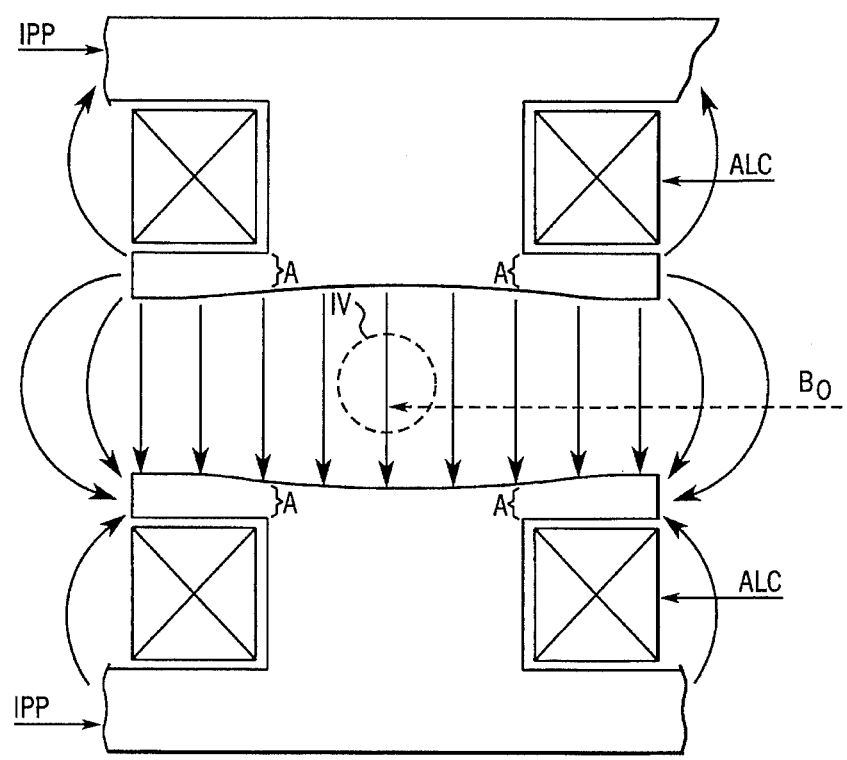
FIG. 2 shows the operating principle of the invention and a homogeneous magnetic field $B_o$ generated by the apparatus.

The imaging field $B_o$ is homogeneous and constant strength, for example in the order of 0.05–0.2 Teslas. FIG. 2 illustrates the field shape between pole pieces IPP. The field $B_o$ can be made homogeneous by selecting a suitable shape for pole pieces IPP. The shape is one in which the opposing surfaces of the pole pieces are roughly parallel planes normal to an axis aligned with the central lines of flux, yet one in which the field $B_o$ has been subjected to fine tuning by giving the pieces IPP a suitable profile somewhat deviating from straight parallelism. Typically, the air gap is at its smallest at the pole edges and, with a series of bends or curves, becomes larger when progressing toward the center of the magnet. Thus, in the center area of the magnet it is possible to produce an approximately spherical imaging area IV having a diameter which is about half the size of the pole gap and wherein the field has a necessary homogeneity (constant with the accuracy of a few tens of millionths). The central area is surrounded by a peripheral edge zone in each of the pole pieces. The edge zone may occupy at least 30% preferably 50% or more, of the area of the air gap along the pole pieces. A suitable flux return path is provided in the pole pieces IPP.

Figure 3:
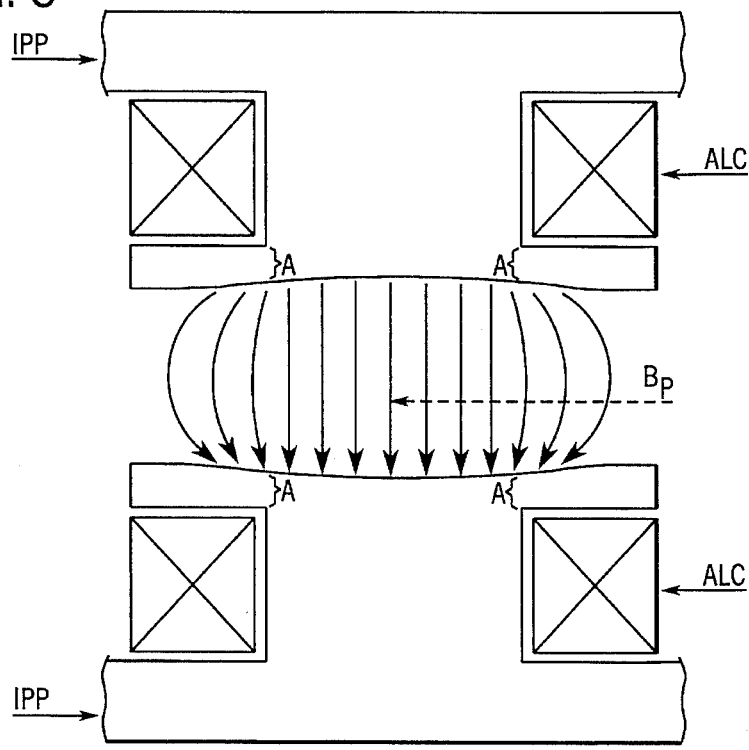
FIG. 3 further shows the operating principle of the invention and a pre-polarization field $B_p$ generated by the apparatus.

When the current is increased in magnet coils ALC, the field will increase to reach the value $B_p$ (FIG. 3). At the same time, the edge zones of pole pieces IPP lying proximate to coils ALC become saturated since, according to the invention, the vertical cross-sectional areas A of the edge zones, shown in FIGS. 2 and 3 and through which the flux passes into the edge zones, are designed in such a manner as to be close to saturation at the field value $B_o$. Thus, the field profile changes in a manner such that, when the field strength extends beyond the value $B_o$ to the value $B_p$, the profile is as shown in FIG. 3. At this time, the edge zones no longer spread the additional flux towards the edges of the air gap, so the field is even more concentrated than before. Thus, the supplied amount of flux is capable of producing a field which is stronger in the imaging area.

While the novel field profile is not as homogeneous as that of the $B_o$-field, it is abundantly sufficient for the $B_p$-field. Thus, the novel invention is characterized in that the magnetic flux producing the $B_p$-field partially or completely saturates a ferromagnetic substance, through which it travels, with a result that the $B_p$-field will thus be intensified.

The following is an exemplary description of a magnet for a magnetic resonance imaging apparatus of the invention.

If the selected object to be imaged is a human head, the suitable imaging volume IV will be spherical in nature with a diameter of 24 cm. Thus, the gap between pole pieces must be selected to be approximately 45 cm and the diameter, about an axis parallel to the lines of flux, of approximately 96 cm. Coils ALC are wound about the same axis. In addition, the selected value for a $B_o$-field will be 0.1 Teslas. The flux circulating between pole pieces is in this case approximately 0.12 Webers. When the field is increased to the value $B_p$=0.2 Teslas, the circulating flux will increased by 0.06 Webers.

The polarizing field pulse used to increase the field to the value $B_p$ can preferably have a duration of e.g. 0.3 s and be in the form of a semi-sinusoidal cycle. The required voltage is in cosine form and has an initial value of $\pi \times 0.06$ Vs/0.03 s times the number of turns of the coils.

A suitable number of turns is e.g. 600, whereby the voltage pulse has a peak value of 377 V. This number of turns requires approximately 30–35 A for a field of 0.1 T. Aluminum windings will have a resistance of approximately 1 ohm. The amount of iron required by the magnet is obtained from the total flux of 0.18 Wb, i.e. the $B_p$-field. The selection of a mean flux density of 1.6 T results in the required amount of iron of 4200 kg. Since the shape of the pulse field is not critical, it may be possible to select even a higher value than 1.6 T for the saturation flux density.

Thus, through use of the present invention, in this exemplary embodiment, the saving of pulse voltage is by the factor of approximately 2 and the saving of iron mass by the factor of 1.5 or more.

It will be appreciated that, if desired, the $B_o$-field can be generated in whole or in part by a permanent magnet and the energization of coils ALC used to increase the field to the magnitude of the $B_p$-field. Thus one of pole pieces IPP could form one pole of a permanent magnet and the other pole piece could form the other pole of a permanent magnet.

I claim:

1. An apparatus for magnetic resonance imaging employing an imaging magnetic field ($B_o$) of a preselected magnitude and a pre-polarization magnetic field ($B_p$) which is increased in magnitude with respect to the imaging field by a magnetic field magnitude increment, said apparatus comprising:

a ferromagnetic core for carrying magnetic fluxes for the magnetic fields employed in said apparatus, said core having a pair of opposing pole pieces forming an air gap in which the magnetic fields are established; each of said pole pieces having a central portion, the opposing central portions forming a central area in said air gap for receiving an object to be imaged; each of said pole pieces having a peripheral edge portion surrounding the central portion of the pole piece; said core having a magnetic flux for the imaging magnetic field ($B_o$) established therein, said core having a flux path in said core for the magnetic flux for the imaging magnetic field ($B_o$) that includes said central portions and peripheral portions of said pole pieces;

means operatively associated with said core for generating a further magnetic flux in said core that is flowable in a flux path substantially co-extensive with that for the flux of said imaging magnetic field ($B_o$), said fluxes being additive in said core, said further magnetic flux providing said magnetic field magnitude increment;

said pole pieces of said ferromagnetic core being formed such that, at the magnitude of the imaging magnetic field ($B_o$), the central portion and peripheral edge portions of said pole pieces are magnetically unsaturated so that the flux for the imaging magnetic field ($B_o$) flows through said central portions and peripheral edge portions to establish an imaging magnetic field ($B_o$) that is substantially uniform throughout the air gap formed between said central portions and peripheral portions of said pole pieces, said pole pieces being further formed such that, when the further magnetic flux for the magnetic field magnitude increment is added to the flux for the imaging magnetic field ($B_o$) in said core, said peripheral edge portions of said pole pieces are driven into saturation by the combined flux, the configuration of said pole pieces being such that the portion of the further magnetic flux beyond that required to saturate said peripheral portions flows through said central portion so that the increment of magnetic field magnitude increase is restricted to said central area of said air gap formed by said opposing central portions of said pole pieces and is additive to said imaging magnetic field ($B_o$) throughout said central area to increase the magnitude of the magnetic field in said air gap from that of the imaging magnetic field ($B_o$) to that of the pre-polarization magnetic field ($B_p$) throughout the central area.

2. A magnetic resonance imaging method in which an object to be imaged is placed in an air gap between the central portions of opposing pole pieces of a magnetic core suitable for carrying a magnetic flux, each of said central portions of said pole pieces being surrounded by a peripheral edge portion, said peripheral edge portions being driven into magnetic saturation by a magnetic flux of a predetermined magnitude, said method comprising the steps of:

establishing a magnetic flux in a flux path, including the central portions and peripheral portions of said pole pieces, said magnetic flux having a magnitude less than said predetermined magnitude to establish a substantially uniform magnetic field in the air gap between the central portions and peripheral edge portion of the opposing pole pieces the magnetic flux providing a magnetic field corresponding to an imaging magnetic field ($B_o$) of preselected magnitude;

generating, for a finite period, a further magnetic flux in the core that is flowable in a flux path substantially coextensive with that for the flux of said imaging magnetic field ($B_o$), said further magnetic flux being additive to the flux of said imaging magnetic field, the added magnetic fields having a magnitude greater than said predetermined magnitude and causing the peripheral portions of the pole pieces to saturate so that the portion of the further magnetic flux beyond that required to saturate the peripheral portions flows through said centrol portion and so that the magnetic field generated by the further magnetic flux is restricted to the central portions of said pole pieces to increase the magnetic field throughout the central portions to that of a pre-polarization magnetic field ($B_p$); and, thereafter allowing the magnetic field to return to the preselected magnitude to form the imaging magnetic field ($B_o$) and carrying out magnetic resonance imaging of the object.

3. An apparatus as set forth in claim 1, further including means for generating the imaging magnetic field.

4. An apparatus as set forth in claim 3, wherein said imaging magnetic field generation means comprises electromagnetic coil means (ALC).

5. An apparatus as set forth in claim 4, wherein said electromagnetic coil means is further defined as generating both said imaging magnetic field and said magnetic field increment.

6. An apparatus as set forth in claim 1, wherein said core comprises permanent magnet for generating at least a part of said imaging magentic field.

7. An apparatus as set forth in claim 1, wherein said peripheral edge portion of each of said pole pieces has a surface area which is at least 30% of the surface area of said air gap along the pole piece.

8. An apparatus as set forth in claim 7, wherein said peripheral edge portion of each of said pole pieces has a surface area which is at least 50% of the surface area of said air gap along the pole piece.

9. The method according to claim 2 further defined as energizing the electromagnetic coil means with a pulse of current.

10. An apparatus as set forth in claim 1 wherein said peripheral edge portion of each pole piece extends between said magnetic field increment generating means and said air gap for carrying the flux of the imaging magnetic field to the peripheral edge portion; a cross-sectional area of said peripheral edge portion normal to the direction at which flux is carried to the peripheral edge portion being such as to cause said peripheral edge portion to become saturated at the increased magnitude of the prepolarization field ($B_p$) so that the increase in the magnetic field to the magnitude of the pre-polarizing field ($B_p$) occurs in the central area between said pole pieces.

11. An apparatus as set forth in claim 5 wherein said peripheral edge portion of each pole piece extends between said electromagnetic coil means and said air gap for carrying the flux of the imaging magnetic field to the peripheral edge portion; the cross-sectional area of said peripheral edge portion normal to the direction at which flux is carried to the peripheral edge portion being such as to cause said peripheral edge portion to become saturated at the increased magnitude of the pre-polarization field ($B_p$) so that the increase in the magnetic field to the magnitude of the pre-polarizing field ($B_p$) occurs in the central area between said pole pieces.

12. The method according to claim 2 further defined as energizing an electromagnetic coil means with current to increase the magnitude of the magnetic field.

13. The method according to claim 9 wherein current pulse has a duration of less than a second.

14. The method according to claim 2 wherein the magnitude of the pre-polarizing field is twice the magnitude of the imaging field.

* * * * *